United States Patent
Gillies et al.

(10) Patent No.: US 7,069,483 B2
(45) Date of Patent: Jun. 27, 2006

(54) SYSTEM AND METHOD FOR IDENTIFYING NODES IN A WIRELESS MESH NETWORK

(75) Inventors: Donald W. Gillies, San Diego, CA (US); Weilin Wang, San Diego, CA (US); Michael P. Nova, Del Mar, CA (US)

(73) Assignee: Kiyon, Inc., La Jolla, CA (US)

( * ) Notice: Subject to any disclaimer, the term of this patent is extended or adjusted under 35 U.S.C. 154(b) by 0 days.

(21) Appl. No.: 10/437,128

(22) Filed: May 13, 2003

(65) Prior Publication Data

US 2003/0212941 A1 Nov. 13, 2003

Related U.S. Application Data

(60) Provisional application No. 60/380,425, filed on May 13, 2002.

(51) Int. Cl.
*G01R 31/28* (2006.01)

(52) U.S. Cl. ...................................... 714/712
(58) Field of Classification Search ................ 714/726, 714/727, 729, 730, 733, 712, 748, 30
See application file for complete search history.

(56) References Cited

U.S. PATENT DOCUMENTS

| | | |
|---|---|---|
| 6,003,007 A | 12/1999 | DiRienzo |
| 6,076,066 A | 6/2000 | DiRienzo et al. |
| 6,161,104 A | 12/2000 | Stakutis et al. |
| 6,199,115 B1 | 3/2001 | DiRienzo |
| 6,226,642 B1 | 5/2001 | Beranek et al. |
| 6,272,492 B1 | 8/2001 | Kay |
| 6,282,513 B1 | 8/2001 | Strawder |
| 6,289,316 B1 | 9/2001 | Aghili et al. |
| 6,292,596 B1 | 9/2001 | Snyder et al. |
| 6,331,762 B1 | 12/2001 | Bertness |
| 6,336,114 B1 | 1/2002 | Garrison |
| 6,338,093 B1 | 1/2002 | DiRienzo |
| 6,343,310 B1 | 1/2002 | DiRienzo |
| 6,345,260 B1 | 2/2002 | Cummings, Jr. et al. |
| 6,349,334 B1 | 2/2002 | Faupel et al. |
| 6,357,010 B1 | 3/2002 | Viets et al. |
| 6,366,683 B1 | 4/2002 | Langlotz |
| 6,366,912 B1 | 4/2002 | Wallent et al. |
| 6,366,929 B1 | 4/2002 | Dartigues et al. |
| 6,385,730 B1 | 5/2002 | Garrison |
| 6,434,191 B1 * | 8/2002 | Agrawal et al. ............. 375/227 |
| 6,671,840 B1 * | 12/2003 | Nagoya ..................... 714/727 |
| 6,868,072 B1 * | 3/2005 | Lin et al. .................... 370/276 |

* cited by examiner

*Primary Examiner*—Albert Decady
*Assistant Examiner*—James C. Kerveros
(74) *Attorney, Agent, or Firm*—Procopio Cory Hargreaves & Savitch LLP; Pattric J. Rawlins

(57) ABSTRACT

Systems and methods for providing a boundary scan test of a wired or wireless network having a plurality of network nodes are presented. The system includes a test station communicatively coupled with the network. The test station creates a MAC layer scan test route sequence that includes each link in the network and is independent of the routing mechanism and protocol used for the network. The test station also creates a test agent that is configured to traverse each link in the scan test route sequence. The test agent is then deployed on the network and information about a link is reported back to the test station after the test agent examines the link. The scan test route sequence can be created by sending out a series of broadcast messages from one or more nodes in the network, sequentially applying a network tour to cover the entire network, or performing a depth first search on the entire network.

18 Claims, 9 Drawing Sheets

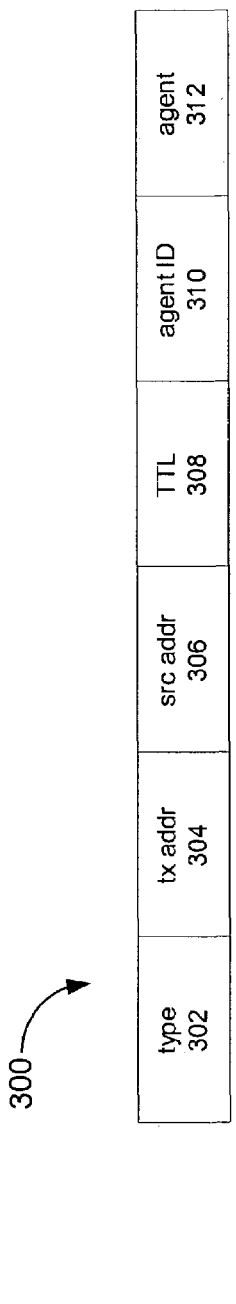

| node | | address |
|---|---|---|
| A | = | 0 |
| B | = | 1 |
| C | = | 7 |
| D | = | 11 |
| E | = | 2 |
| F | = | 4 |
| G | = | 8 |
| H | = | 12 |
| I | = | 14 |

SYSTEM AND METHOD FOR IDENTIFYING NODES IN A WIRELESS MESH NETWORK

RELATED APPLICATION

The present application claims priority to U.S. provisional patent application Ser. No. 60/380,425 filed on May 13, 2002, which is incorporated herein by reference in its entirety.

BACKGROUND

1. Field of the Invention

The present invention generally relates to digital data transmission in a communication network and more specifically relates to mechanisms for performing a boundary scan or roving link test on a wired or wireless network.

2. Related Art

Today's networks are very error-prone and difficult to deploy, diagnose and repair. When a network fails, it is difficult and labor intensive to locate the trouble spots. For example, in a system where routing tables are used, the information in the routing table is no longer valid when a failure has occurred. An internet control message protocol ("ICMP") or similar type of protocol can be used to report errors, locate certain faults and monitor network performance. A significant drawback in self-organizing wired or wireless packet networks, however, is the inability to test all possible alternate routes, i.e., routes that are not currently in use but may be required when existing routes have unsatisfactory signal transmission or total failure.

Boundary scan support devices allow the IEEE 1149.1 standard joint test action group ("JTAG") to be used as a backplane bus which opens up possibilities of backplane interconnect test and multi-drop architectures, enabling backplane-to-board-to-chip diagnostics in system integration and field service scenarios. For example, all the memory components of an IC chip can be connected in a long shift register, at minimal overhead, and then a general-purpose serial port on the chip is used to shift arbitrary test vectors into and out of the chip. These test vectors allow the whole chip to be exercised and the results compared to a working chip to verify correctness. All complex chips today are tested via JTAG capable interfaces, and the technology is also used to implement hardware debugging of microprocessors.

In addition, development of the IEEE 1532-2000 in-system configuration standard leverages IEEE 1149.1 structures to enable programming of complex programmable logic devices ("CPLDs") and field programmable gate arrays ("FPGAs") in situ. Today the IEEE 1149.1 standard is limited to digital electronics, and commonly covers only chips with JTAG capabilities. Nevertheless, in a few years, the IEEE 1149.4 standard for a Mixed-Signal Test Bus, will make testing of analog circuitry possible as well.

Graph theory is an area of mathematics that deals with entities (called nodes) and the connections (called links) between the nodes. An important traversal problem is to find a tour in a given graph that traverses each edge exactly once and end up at the originating node. Such a tour is called an Euler tour. An Euler tour is possible only if every node has an even number of links attached to it. This is called having an even degree.

Since an Euler tour does not exist in all graphs, a common problem is to determine a minimum length tour that traverses each link at least once. This problem is known as the postman problem. A process called graph Eulerization is used to add duplicate links to the graph. These duplicate links are added in such a fashion that they provide each node in the graph with an even number of attached links. A generalization of the postman problem, known as the rural postman problem, is to determine a least cost traversal of a specified subset of links in the graph. A rural postman tour of an undirected or directed graph can be computed in polynomial time, whereas a rural postman tour of a mixed graph (i.e., a graph having undirected and directed links) is NP-hard. A simple solution is to replace all sub-graphs of even degree with edges indicating a traversal cost, and then compute a minimum matching on the vertices of odd degree.

In recent years network protocol conformance tests have been created that use the rural postman tour algorithm. In this technique, two deterministic finite state machines are used to model the protocol specification and the protocol implementation, respectively. The test is thus to compare the results of the traversal by the two state machines, with a focus of minimizing the total test sequence length. A postman tour technique can similarly be used for traversing all of the links of a network based on the network routing tables. However, the time varying signal transmission and reception conditions in a network often make a statically constructed rural postman tour incomplete at run time. Therefore, the industry lacks a robust way to test the link status of a wired or wireless network in real time a need has been created for a solution that has yet to be filled.

SUMMARY

Accordingly, the method and algorithms disclosed herein apply to a communication network that contains a plurality of network devices (also referred to herein as "network nodes," "nodes," or "network stations") that each have a means for communicating over the communication network. Independent of the existing routing mechanism and protocol used for network protocol and routing communications, a scan test route sequence is constructed. This is accomplished by a sequence of broadcast operations by individual nodes in the network under test. Alternatively, the scan test route sequence can be constructed by successively applying the rural postman ("RPT") tour algorithm. The successive use of the RPT algorithm avoids the broadcast operations that may flood the network. In another arrangement, the scan test route sequence is computed online as the network structure is explored with a depth first search ("DFS") algorithm from a test station by constructing a scan chain table at each node in the network.

Once the scan test route sequence has been established, a roving test agent is deployed to traverse each link in the route sequence. The roving test agent is an abstract data type that is transmitted over the network in the data payload of one or more communication packets. The roving test agent may contain source route information, attributes to be tested, and intermediate results. The roving test agent may also contain executable code that can be invoked at each or selected network nodes to perform or modify the tests already to be performed by the agent. The attributes under test can be link connectivity, nodal routing configuration, or other attributes of interest.

It will be apparent from what follows that the invention provides a number of important advantages over prior approaches. The invention provides a lower layer mechanism to automatically trouble shoot a wired or wireless network without dependence on the network protocol layer or the corresponding established routing tables. Furthermore, by bypassing the normal routing system the invention advantageously avoids a circular dependency on routing tables that may be faulty. Thus, a robust and simplified solution is provided to rapidly find connectivity problems in a network.

BRIEF DESCRIPTION OF THE DRAWINGS

The details of the present invention, both as to its structure and operation, may be gleaned in part by study of the accompanying drawings, in which like reference numerals refer to like parts, and in which:

FIG. 6 is a block diagram illustrating an example broadcast message frame according to an embodiment of the present invention;

FIG. 7 is a block diagram illustrating an example response message frame according to an embodiment of the present invention;

FIG. 8 is a block diagram illustrating an example network tour message frame according to an embodiment of the present invention;

DETAILED DESCRIPTION

Certain embodiments as disclosed herein provide for systems and methods for implementing a boundary scan test in a wired or wireless network. For example, one method as disclosed herein allows for a test station on a network to create a medium access control ("MAC") layer scan test route sequence using a depth first search technique and then spawn a test agent that traverses the links in the scan test route sequence and reports back to the test station information pertaining to the various links in the scan test route sequence.

After reading this description it will become apparent to one skilled in the art how to implement the invention in various alternative embodiments and alternative applications. However, although various embodiments of the present invention will be described herein, it is understood that these embodiments are presented by way of example only, and not limitation. As such, this detailed description of various alternative embodiments should not be construed to limit the scope or breadth of the present invention as set forth in the appended claims.

Figure 1:
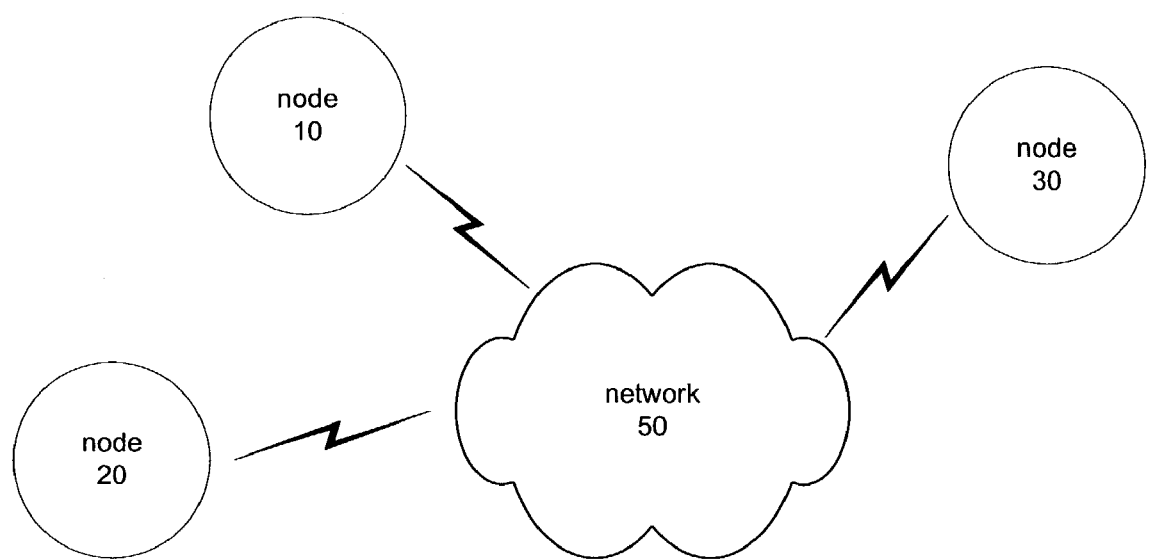
FIG. 1 is a high level network diagram of an example wired, wireless, or hybrid network topology according to an embodiment of the present invention.

FIG. 1 is a high level network diagram of an example wired, wireless, or hybrid network 50 according to an embodiment of the present invention. In the illustrated embodiment, the system comprises a network 50 that communicatively couples a plurality of network devices 10, 20, and 30.

The network 50 can be a wired network, a wireless network, or a combination of homogeneous or heterogeneous networks including both wired and wireless. Network 50 can be a personal area network ("PAN"), a local area network ("LAN"), a wide area network ("WAN"), or a distributed combination of networks collectively comprising a global communications network such as the Internet. Network 50 can be an ad hoc network or a persistent network and can be fixed in location, mobile, or network 50 may comprise a combination of fixed and mobile components. Additionally, network 50 may carry communications corresponding to a single network protocol or to multiple network protocols. For example, network 50 may carry 802.3 Ethernet traffic and 802.11 wireless traffic.

A network device is preferably a device that is capable of communication over a communication network such as network 50. For example, network device 10 can be a personal computer ("PC"), laptop computer, printer, tablet PC, a TV set-top box, a gaming station, or a wireless communication device such as a personal digital assistant ("PDA"), cell phone, pager, or other device with the ability to communicate data over a wireless network. Preferably, a variety of different network devices such as network device 10, 20, and 30 are communicatively coupled via the network 50.

In this detailed description, a network device such as network device 10 may be referred to as a network device, network node, node, wireless communication device, wireless network device, and wireless node. Although various names may be used herein, a network device may comprise all or a minimal subset of the components and functional capabilities described with respect to FIGS. 12 and 13.

Figure 2:
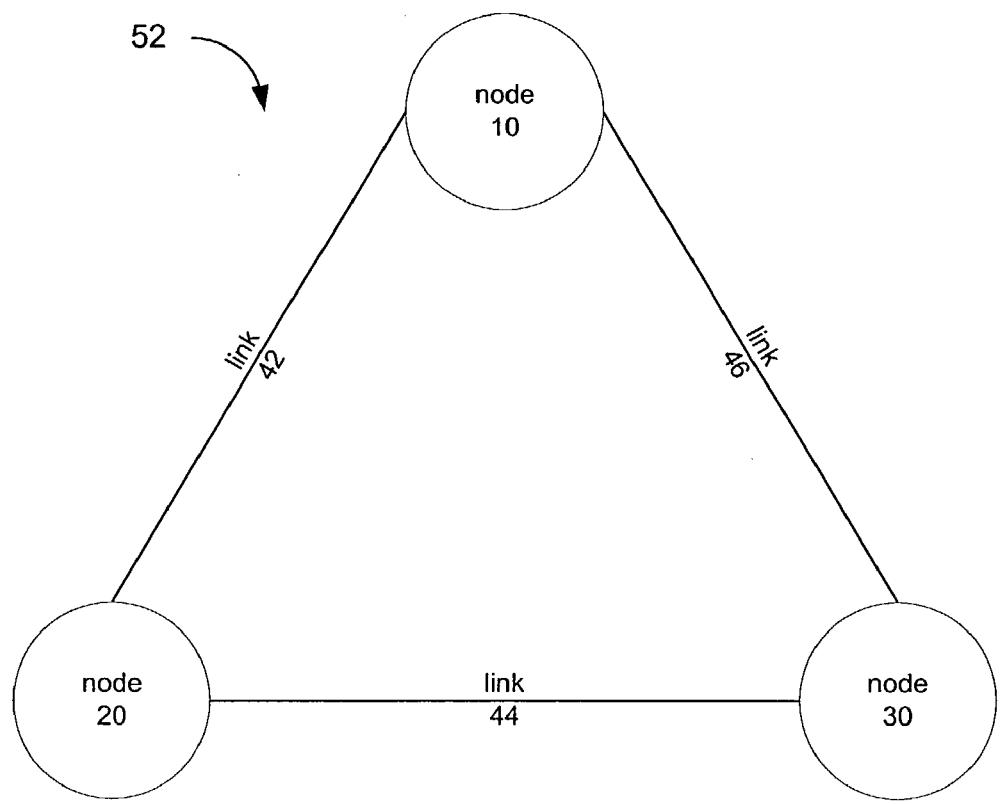
FIG. 2 is a network diagram illustrating an example set of links connecting various nodes in a network according to an embodiment of the present invention.

FIG. 2 is a network diagram illustrating an example set of links connecting various nodes in a network according to an embodiment of the present invention. In the illustrated embodiment, network devices 10, 20, and 30 are communicatively coupled via a series of links. For example, link 42 connects node 10 and node 20, link 44 connects node 20 and node 30, and link 46 connects node 30 and node 10. Traversing link 42, 44, and 46 in succession accomplishes a network tour, which in the illustrated embodiment is also an Euler tour.

For purposes of consistency and simplification of the detailed description, the various links referred to herein and described in detail will be described as bi-directional and symmetrical communication links. Thus, a successful test of a link from a particular direction, i.e., from a particular source node to a particular destination node, indicates that a test of the same link originating from the initial destination mode and traveling to the initial originating node will also be successful. However, as will be understood by one having skill in the art, the broad scope contemplated by the present detailed description includes the application of the described techniques to both directional and asymmetrical communication networks.

Figure 3:
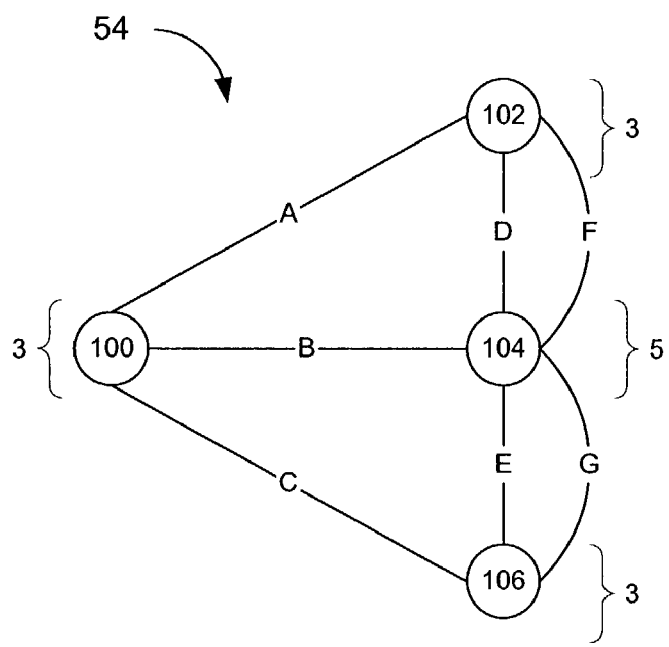
FIG. 3 is a graph diagram illustrating an example set of links between nodes with an odd degree according to an embodiment of the present invention.

FIG. 3 is a graph diagram illustrating an example set of links between nodes with an odd degree according to an embodiment of the present invention. In the illustrated embodiment, a network 54 comprises nodes 100, 102, 104, and 106. Communication link A connects nodes 100 and 102. Communication link B connects nodes 100 and 104. Communication link C connects nodes 100 and 106. Similarly, communication links D and F connect nodes 102 and 104, while communication links E and G connect nodes 104 and 106. Also shown is the degree of each node, with nodes 100, 102 and 106 having a degree of three while node 104 has a degree of five.

The illustrated network graph is not in Euler form, meaning that in order to traverse each link a single time, some links in the graph must be traversed more than once. For example, traversing the links in the order A, F, D, F, G, E, B, C, C would travel each link at least once and end up back at the originating node, although links F and C would be traveled twice.

Figure 4:
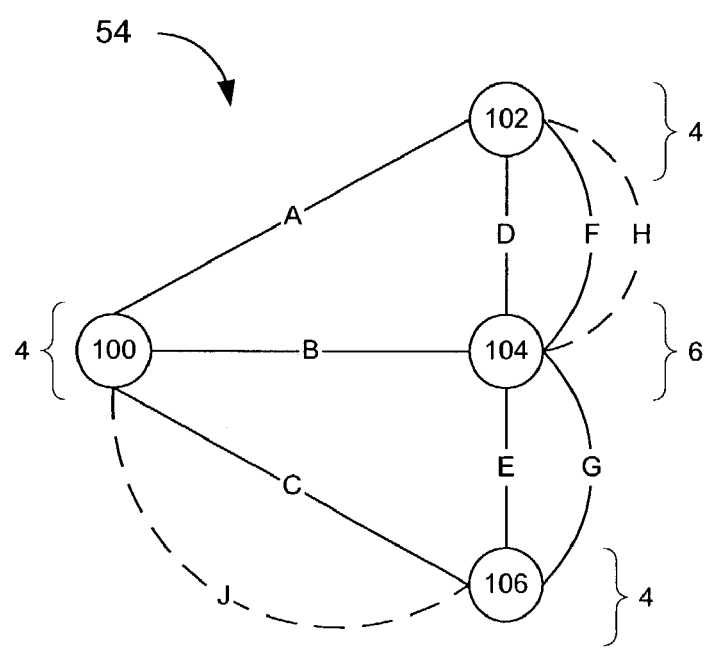
FIG. 4 is a graph diagram illustrating an example Eulerized set of links between nodes with an even degree according to an embodiment of the present invention.

FIG. 4 is a graph diagram illustrating an example Eulerized set of links between nodes with an even degree according to an embodiment of the present invention. In the illustrated embodiment, network 54 again comprises nodes 100, 102, 104, and 106. Communication link A connects nodes 100 and 102. Communication link B connects nodes 100 and 104. Communication links C and J connect nodes 100 and 106. Similarly, communication links D, F, and H connect nodes 102 and 104, while communication links E and G connect nodes 104 and 106. Also shown is the degree of each node, with nodes 100, 102 and 106 having a degree of four while node 104 has a degree of six. Because each node has an even degree, the network graph is in Euler form. Thus, traversing the links in the order A, F, D, H, G, E, B, C, J would travel each link a single time and end up back at the first node, namely node 100.

Figure 5:
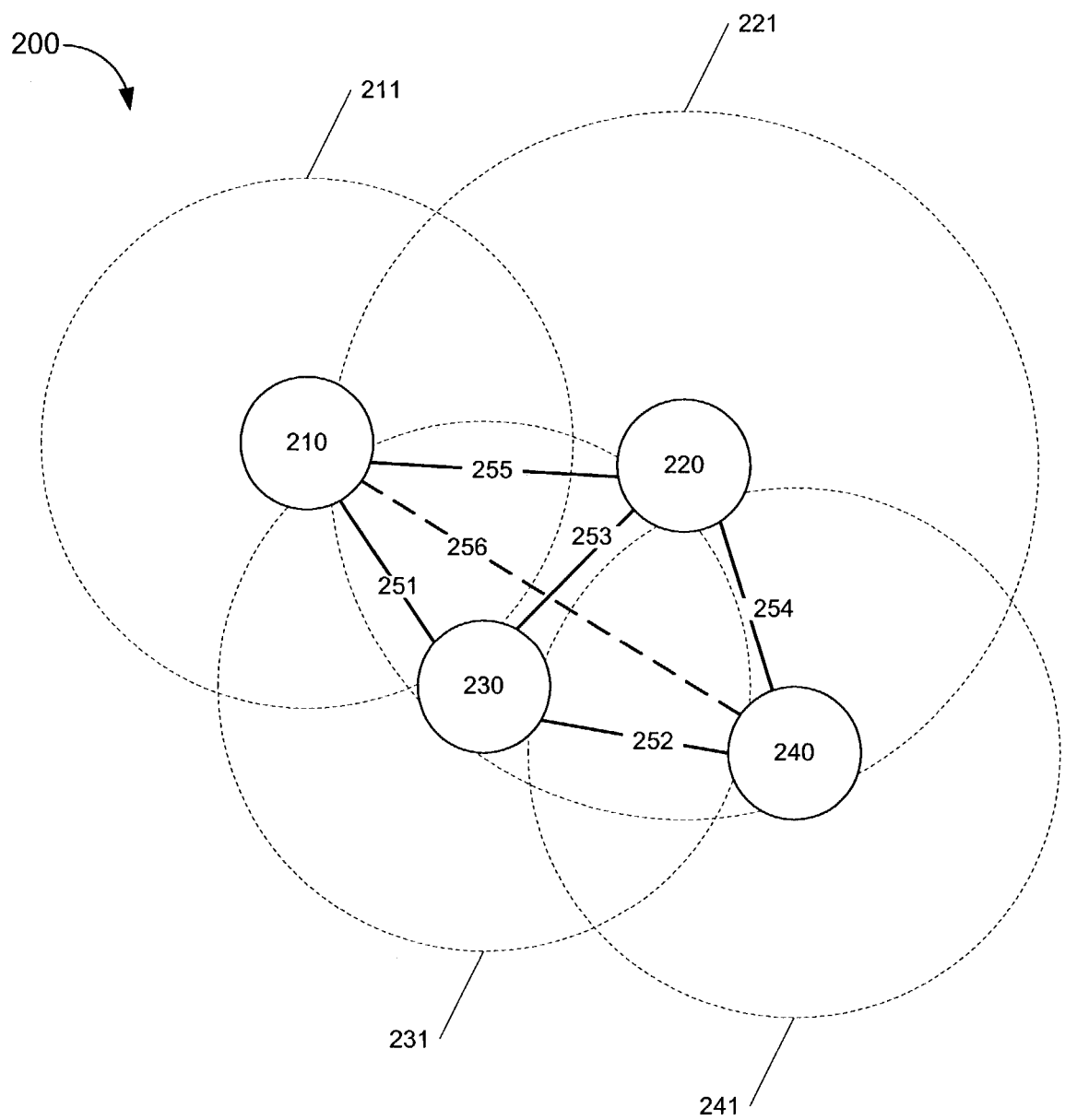
FIG. 5 is a network diagram illustrating an example set of network devices with their corresponding communication ranges and possible communication links according to an embodiment of the present invention.

FIG. 5 is a network diagram illustrating an example set of network devices 210, 220, 230, and 240 with their corresponding communication ranges 211, 221, 231, and 241 respectively. Additionally shown are the universe of possible communication links 251, 252, 253, 254, 255, and 256. The network 200 has a maximum radius of two hops because any communication packet broadcast by any node will be seen by each node in the network in at most two hops.

In the illustrated embodiment, a sequential broadcast process can be employed to create a scan test route sequence. For example, node 210 initially sends a single hop broadcast message that is received only by node 230. The broadcast message can be a communication packet or a roving agent. In one embodiment, the communication packet may have a test agent in its data payload. Upon receipt, node 230 verifies the link 251 with an acknowledgement message and the quality of link 251 is recorded. After verifying the link and recording the link quality, node 230 (and any other node receiving the initial broadcast) sends a corresponding single hop broadcast message that is received by node 210, node 220, and node 240.

Node 210, as the originator of the broadcast message, suppresses the broadcast message sent out by node 230. On the other hand, nodes 220 and 240 acknowledge the broadcast message, thereby verifying link 253 and link 252, respectively. The corresponding link qualities are also recorded. The next node to resend the broadcast message (either node 220 or node 240) will cause the link 254 to be verified by acknowledgement and the link quality recorded. Additionally, when node 220 resends the broadcast message the broadcast message reaches node 210. Because node 210 did not initially get an acknowledgement from node 220, it may discard the broadcast message and thereby not verify the link 255. Alternatively, node 210 may send an acknowledgment message to node 220 via node 230 and thereby verify the link 255. Advantageously, node 220 can determine from the acknowledgment message received via node 230 that the link 255 is a unidirectional link. Notably, the potential link 256 is never verified and therefore does not exist or is identified as unusable.

Advantageously, the results of the test broadcast messages are passed back to node 210 in a directional traceback (e.g., reverse order) method. For example, node 240 sends the link verifications and link qualities it collected from its broadcast message back to node 230, who in turn provides the link verifications and link qualities it collected from its broadcast message back to node 210. Similarly, node 220 sends its link verifications and link qualities to node 230 who once again passes the information along to node 210.

FIG. 6 is a block diagram illustrating an example broadcast message frame 300 according to an embodiment of the present invention. In the illustrated embodiment the message frame 300 comprises a series of fields. The fields include a type field 302 that contains the type of the message, which can be, for example, set to indicate that the message is a scan test route sequence broadcast, as previously described with respect to FIG. 5. Also included is a transmitter address field 304, a source node address field 306, a time-to-live field 308 that indicates the number of hops remaining before the packet is discarded, an agent identification field 310, and an agent field 312 that preferably contains the agent itself. For example, the agent field 312 may include executable instructions.

FIG. 7 is a block diagram illustrating an example response message frame 400 according to an embodiment of the present invention. In the illustrated embodiment, the message frame 400 comprises a series of fields. The fields include a type field 402 that indicates the type of unicast response message. Also included is a recipient address field 404, a transmitter address field 406, a destination address field 408, a source node address field 410, a time-to-live field 412, an agent identification field 414, and a results field 416 that preferably contains the results of the scan test broadcast message. In one embodiment, the results field 416 is arranged as a list of links with the corresponding attribute values as determined by the scan test.

FIG. 8 is a block diagram illustrating an example network tour message frame 500 according to an embodiment of the present invention. In the illustrated embodiment the message frame comprises a series of fields. The fields include a type field 502 that contains the type of the message, for example, the type can indicate a successive network tour message used to create a scan test route sequence. Also included is a length field 504, a source route field 506 where the first and last addresses in the field are preferably starting point of the network tour, a time-to-live field 508, an agent identification field 510, an agent field 512, and a results field 514.

In an exemplary embodiment that employs the message frames previously described with respect to FIGS. 6–8, a creation of a scan test route sequence is initiated at an arbitrarily designated node in the network. A broadcast message is sent to allow multiple instances of the roving link test agent included in the broadcast message to traverse throughout the network. For example, the packet format of the broadcast message may take the form of the message frame shown in FIG. 6. Advantageously, the broadcast message frame specifies the broadcast operation in the type field, the transmitter address, the original source node address, time-to-live (TTL) of the packet, the roving test agent ID, and the agent itself. The agent itself typically specifies the test(s) to be performed and the attributes to be tested, and may also include the executable instructions of the test or executable instructions that modify the test.

When the broadcast message (a packet or roving test agent) from the originating node (also referred to as the "designated node") is received by another node, the link between the two nodes is verified and the quality of the link is recorded. Each node receiving the initial broadcast ("tier two nodes") will re-send the broadcast message (e.g., the test agent) and will also discard any subsequently received communication that is the same broadcast message. This defines a broadcast hierarchy in which the originating node is on top, the tier two nodes (i.e., those nodes that are one hop away) are next, and the additional descendants forming tier three, tier four, and so on to the perimeter of the network.

In addition to re-broadcasting the test agent, each recipient node in tiers two and higher will complete the specified link test and provide a unicast response to the parent node that sent the test agent. Such a response message frame was previously described with respect to FIG. 7 and may comprise the receiver address, transmitter address, destination address, source address, agents ID and the results of the test. The test results are typically organized as a list of links with the attribute values that are determined by the test. Advantageously, by each receiver acknowledging the broadcast, the link between a receiver and the broadcaster is exercised and can therefore be verified.

The attributes included in the test results may comprise link connectivity, link quality, relative signal strength indicator, nodal routing configuration or other attributes of interest. In one embodiment, the test results are represented as a bit vector. In this arrangement, a network with 5000 links (e.g., a fully connected network of 100 nodes) requires roughly 0.625 k bytes of data to be carried. The test results can also be transported to the designated node using more than one communication packet, for example in the case of a large network. Test result communications can also be acknowledged and resent if necessary to ensure reliable transportation. A multiple bits/link scheme can also be used to indicate the link quality to various levels of granularity or to incorporate multiple link attributes. Finally, the network scan test advantageously uses small data packets, eliminating routing tables that can clog the network with useless data.

In one embodiment, the test results are recorded at each receiver node and sent back to the broadcaster node via the acknowledgement packets. In such an embodiment, expected that an intermediate node (e.g., tier two node) may provide an acknowledgement multiple times. For example, in a network with a radius of m hops for the aforementioned broadcast operations (i.e., m−1 tiers), the maximum number of acknowledgement operations for a broadcast initiated at the originating node occurs at the nodes that are one hop away from the designated node, for a total of m acknowledgements.

Here the network radius is defined as the minimum number of broadcast operations that must be forwarded by the intermediate nodes in order to reach the most remote node. To reduce the number of acknowledgements at the intermediate nodes, the network broadcast radius can be estimated, the per hop round trip delay can be estimated, and a proper value of timeout period can be calculated for all nodes at each broadcast ring of n hops from the designated node. With these timeout parameters, a tier two node will advantageously wait to accumulate most or all of the acknowledgements from its descendent nodes before sending its acknowledgement to the designated node. This arrangement also has the advantage of simplifying the implementation and requiring little memory. Specifically, intermediate nodes only need to know how to send an acknowledgement to its immediate parent node in the broadcast hierarchy while waiting for its own descendant nodes to respond. No extra routing table needs to be built at these nodes to facilitate construction of the scan test route sequence.

Once a timeout period has expired, all the received scan test route sequence results at the designated node can then be used to construct the link map which indicates the connectivity and link quality of each link of the network under test. This link map is the scan test route sequence. Thus, the network boundary scan test requires only a single broadcast operation at each node. Additionally, the network boundary scan test has the advantage of simple implementation and low computation and memory requirements at each intermediate and leaf node.

Figure 9A:
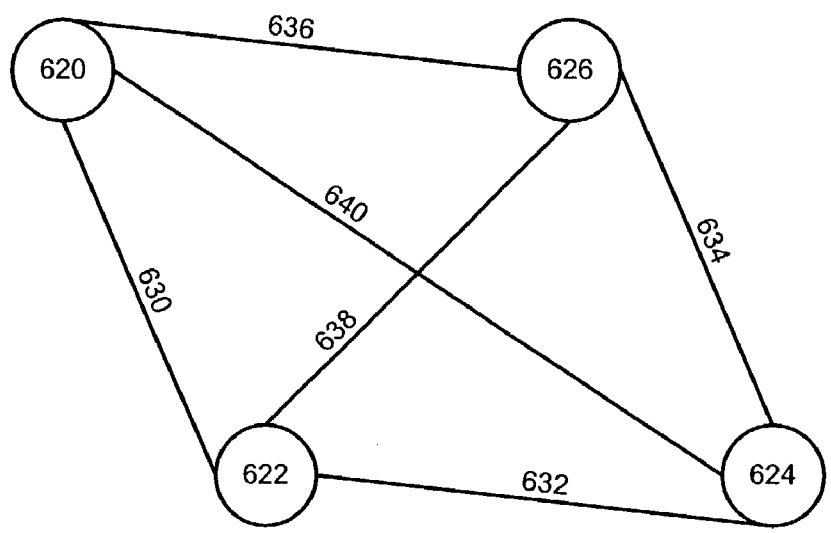
FIGS. 9A–9D are graph diagrams illustrating an example network tour technique for creating a scan test route sequence according to an embodiment of the present invention.
Figure 9B:
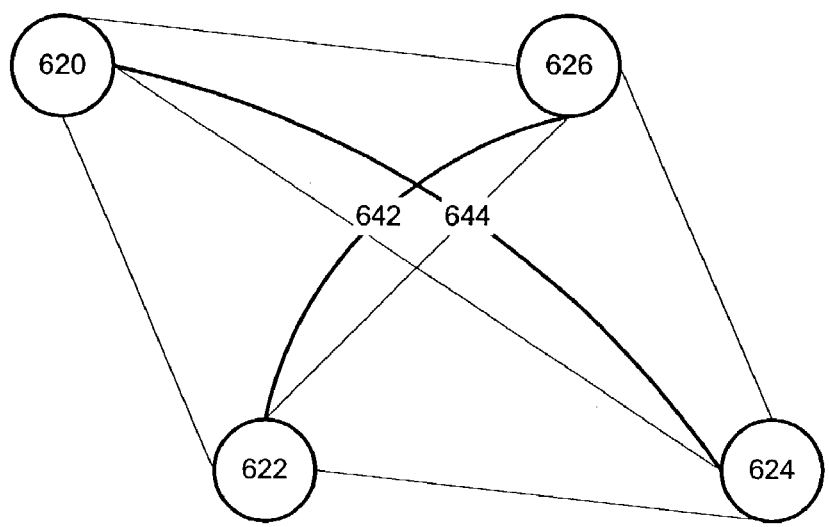

FIGS. 9A–9D are graph diagrams illustrating an example network tour technique for creating a scan test route sequence according to an embodiment of the present invention. In FIG. 9A, a network is shown comprising four nodes 620, 622, 624, and 626. All of the theoretical links are also shown, including links 630, 632, 634, 636, 638, and 640. In FIG. 9B, two additional links 642 and 644 have been added to the network diagram to make the graph comply with the Euler form. As shown in the illustrated embodiment, each node 620, 622, 624, and 626 have an even degree. A network tour (i.e., a postman tour) can now be constructed as:

640, 634, 636, 630, 638, 642, 632, and 644.

Such a network tour begins at node 620, traverses each link in the network exactly once, and finishes at node 620.

Figure 9C:
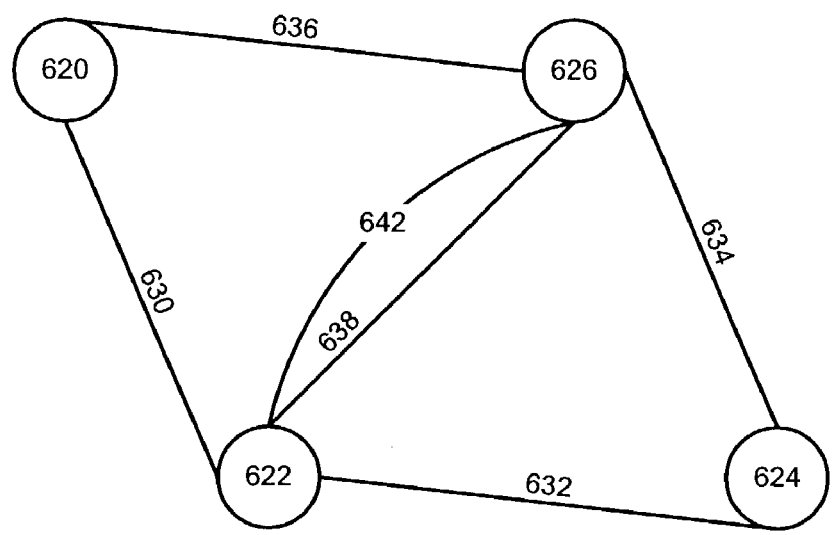

In the embodiment illustrated in FIG. 9C, nodes 620 and 624 are unable to communicate. For example, they may be wireless communication devices that are not in range with each other. Thus, the initial traverse (i.e., test) of link 640 fails to verify. The scan test route sequence creation process therefore deletes link 640 and any equivalent links such as link 644. After such action, the remaining links are shown in FIG. 9C, which requires that the network tour now be constructed as:

636, 634, 632, 638, 642, and 630.

Once again, the network tour begins at node 620, traverses each link in the network exactly once, and finishes at node 620.

Figure 9D:
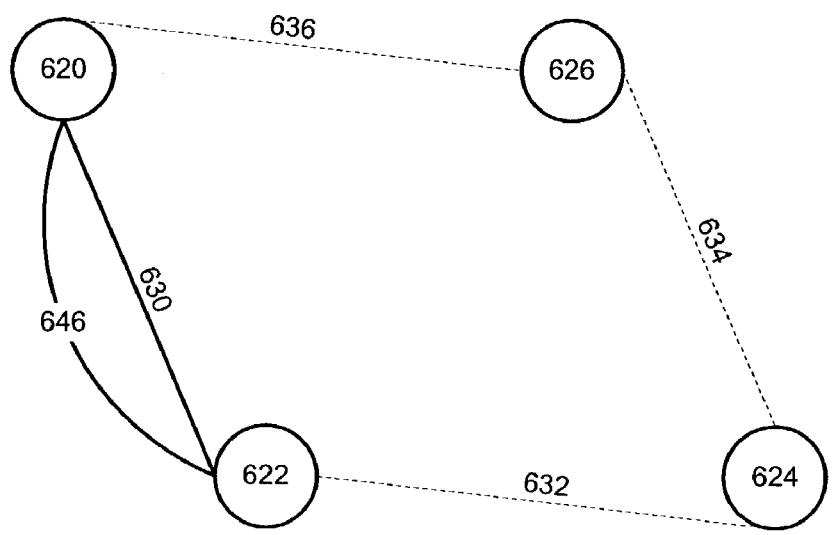

In the embodiment illustrated in FIG. 9D, when the scan test route sequence process reaches node 622 along the new network tour route, a failure on link 638 is detected. At this point, the scan test route sequence process deletes all of the links that have been successfully tested so far and constructs a new network tour for the remaining nodes in the rest of the graph, namely node 620 and node 622 that are connected by link 630. The remaining sub-graph is converted to Euler form by adding a new link 646. The network tour for the sub-graph can now be constructed as:

630 and 646.

Here, the network tour begins at node 622, traverses each link in the remaining sub-network exactly once and finishes back at node 622.

Once the links 630 and 646 are verified, the test results are accumulated and passed back to the original starting point, which is node 620. The path for passing back the results is the reverse order of the reconstituted links, namely 632, 634, and 636 in that order. Alternatively, the scan test route sequence process may detect its arrival back at node 620 after traversing (and verifying) link 630 and the process may terminate there and advantageously eliminate the redundant traversal of link 646 and the trace back node 620 through links 632, 634, and 636.

In an embodiment that employs the rural postman tour, the route scan test sequence is created through a series of rural postman tours constructed for each traversable sub-graph of the network. Specifically, the network under test is represented by an undirected graph. A rural postman tour can thus be constructed and is represented as a complete route through the network that traverses each link ("source route"). A roving test agent is then deployed to traverse the graph according to the source route, and the test agent includes a copy of the source route as it travels throughout the network. For each link traversed, the specified link test is performed and the results recorded. The test results can be reported back to the designated node immediately or carried by the roving test agent for reporting back later.

When a link tests out successfully, the roving test agent advances to the next node according to the source route. If a link tests out unsuccessfully, i.e., if it has failed or is non-existing, the current tour is suspended. At that point, a new sub-graph is constructed, deleting all the links that have been tested, whether successfully or unsuccessfully, and also deleting the nodes that are no longer connected with the sub-graph after the link deletion. A new rural postman tour is then constructed, with the node where the previous tour was suspended as the starting point (e.g., designated node) of the tour. In this fashion, the roving test continues, until a rural postman tour can be finally and successfully completed. The roving test agent can then traverse backward along all the successful links to reach the original starting point of the tour. This way, all links in the network will be tested at least once.

Advantageously, the sub-graph for a subsequently constructed rural postman tour is always simpler (i.e. with fewer links and or fewer nodes) than the graph or sub-graph for the previous tour. This guarantees the algorithm to be convergent. Construction of the rural postman tour is computationally polynomial and can be easily accommodated at a network node, as most modem communication equipment is not constrained by nodal processing power. Moreover, the use of successive rural postman tour calculations avoids broadcast message operations that may unnecessarily flood the network. Complexity (number of transmissions excluding errors) is $O(N^2)$, where N is total number of nodes in the network under test.

Figures 10, 11:
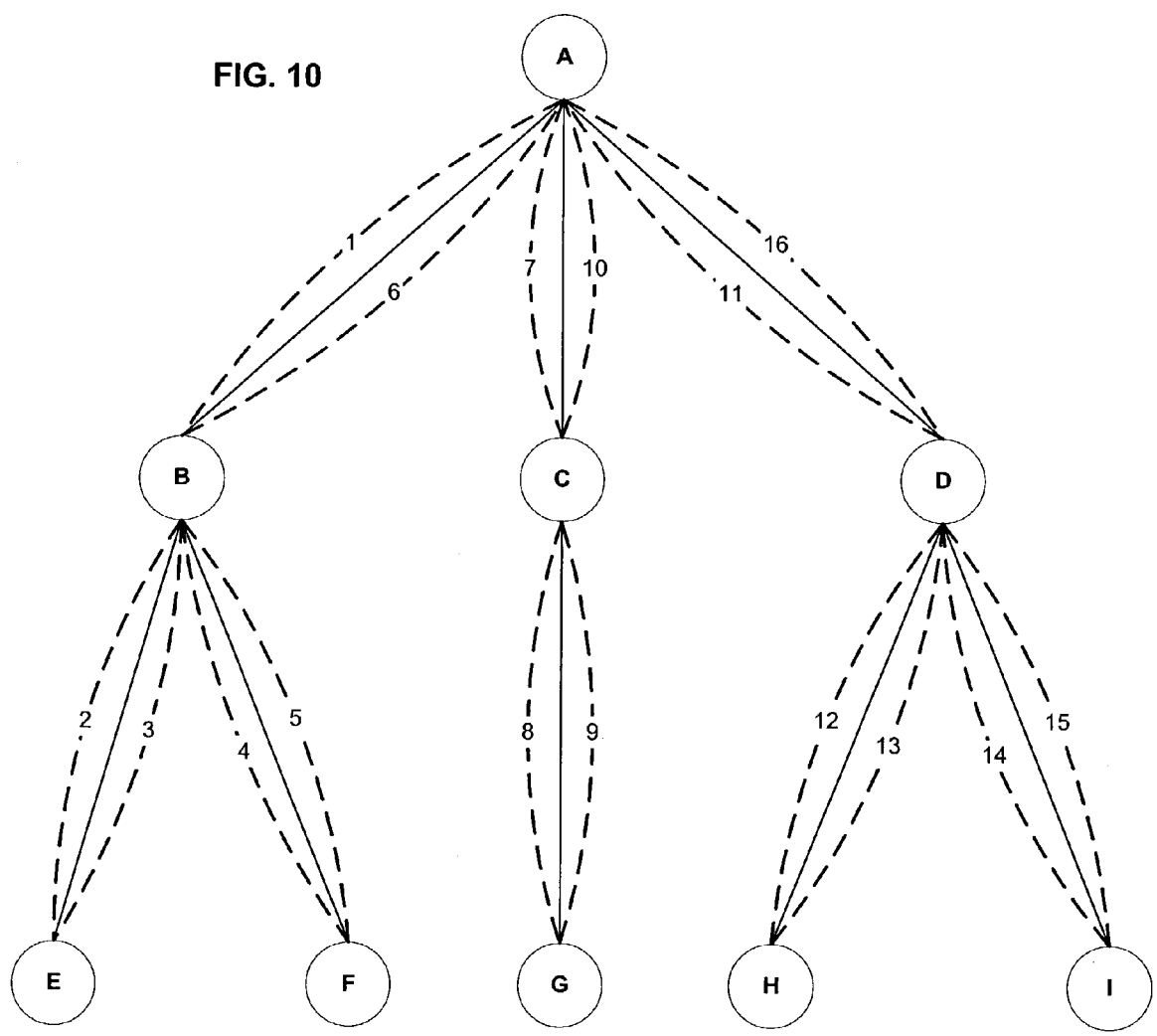
FIG. 10 is a graph diagram illustrating an example depth first search technique for creating a scan test route sequence according to an embodiment of the present invention.
FIG. 11 is an example network address list based on hop count according to an embodiment of the present invention.

FIG. 10 is a graph diagram illustrating an example depth first search technique for creating a scan test route sequence according to an embodiment of the present invention. In the illustrated embodiment, a series of network nodes A–I are shown along with the hierarchical communication links that exist between the various nodes. Additional communication links may also be present, for example, between nodes on a common level such as nodes B, C, and D.

In the illustrated embodiment, the scan test route sequence is computed online as the nodes in the network graph are explored via a depth-first-search process from a test station. As shown, node A is the test station. The depth first search proceeds in two phases. In the first phase, the primary node constructs a scan chain table that includes a list of all of its neighbor nodes. This is done by sending out a broadcast message. In the second phase, the primary node sends a unicast message to each of the nodes in its neighbor list. The unicast messages are sent out in succession so that the second unicast message is not sent until a response from the first unicast message has been received.

Thus, there is a series of broadcast and unicast messages that cause control of the depth first search to traverse through the network to build a comprehensive scan chain table. In the illustrated embodiment, the flow proceeds along the following path:

A, B, E, F, C, G, D, H, I.

In constructing the scan chain table, the test station A selects a test vector identifier that preferably has not been used to initiate any prior scan-chain constructions. Additionally, a depth identifier variable is initially set to be zero. The test station A then asserts itself as the primary node and sends a broadcast echo request to collect a list of all of its nearest neighbors. The broadcast contains the test vector identifier that uniquely identifies this particular testing round. Additionally, the broadcast contains the depth identifier that indicates the number of nodes that have so far been attached to the scan chain (e.g., the number of hops).

When the broadcast echoes are received by test station A, a record is constructed, containing the test vector identifier, depth identifier, neighbor finger (e.g., a pointer to the nearest neighbor) and the list of all the nearest neighbors. The test station A also includes a flag to specify that the scan chain construction will terminate when the last neighbor responds. Finally, test station A sends a unicast message to its nearest neighbor (e.g., node B) that instructs the nearest neighbor to become a primary node and continue the scan chain table construction.

When the nearest neighbor (e.g., node B) receives the unicast message from the test station, it asserts itself as the primry node and sends out a re-broadcast of the test message to identify its closest neighbors. The broadcast message sent out by node B includes the same test vector identifier from the original broadcast. When node B receives its echo responses, it also creates a record containing the test vector identifier, depth identifier, neighbor finger (e.g., a pointer to the nearest neighbor) and the list of all the newest neighbors. Node B also includes in the record a flag to specify that the scan chain table should be returned to node A upon completion, for example by entering node A last in the nearest neighbor list. Finally, node B sends a unicast message to its nearest neighbor (e.g., node B) instructing the node to become the primary node and continue construction of the scan chain table. The unicast message includes the same test vector identifier from the original message but the depth identifier is incremented to indicate that another node has been added to the chain.

The process continues at node E and F and when that portion of the sub-graph returns to the test station A, the test station A advances to its next nearest neighbor identified in its record and instructs node C to assert itself as a primary node and continue constructing the scan chain table. Advantageously, the depth identifier is never reset so that when the test station A sends the unicast message to node C, the depth identifier is seven, reflecting the number of hops (down and back) along the chain to get from node A to node C.

The process continues until the test station advances past the last node in its neighbor list, at which time the scan chain table is complete. Advantageously, the scan chain table can be used to send probe messages through the boundary scan chain. For example, to send a message to the $n^{th}$ node on the scan chain, the test station A sends a broadcast message with three fields. The fields of the broadcast message include: (a) the destination node n; (b) the next hop node k (which is initially one, but is incremented every time the packet is forwarded); and (c) the test vector identifier (which is used to look up the proper scan chain record to be used).

Whenever such a broadcast is sent, with target node n, each node looks up the test vector identifier, and determines if it ever used k as a depth identifier in forwarding a message. If a node has used k, then it accepts the message, and rebroadcasts the message with a next hop identifier of k+1. If a host accepts a message with n=k, then it is the intended recipient and it processes the message. To respond to such a message a new message is generated with a target destination of infinity. This will cause the message to be routed back to the test station A. In the worst case, a greedy online algorithm for the rural postman tour must traverse 2M edges in a graph with M edges. A depth first search as described with respect to FIG. 10 achieves this performance bound and is therefore optimal among all possible greedy online algorithms.

Advantageously, this described depth first search technique for creating a scan test route sequence has the advantage of simple implementation, requires little computation at the network nodes, and avoids network congestion by spreading the scan test messages across the depth of the network graph. Additionally, the technique is scalable to any size of network and results in more reliable communications that are not dependent on the existing routing tables or network layer communication protocols.

FIG. 11 is an example network address list based on hop count (i.e., scan chain position) according to an embodiment of the present invention. In the illustrated network address list, node A has a network address of zero because it is the root node. Node B has a network address of one because it is reached in one hop along the scan test route sequence. Although in conventional routing, node C would also be considered one hop away from node A, according to the scan test route sequence, node C is seven hops away from node A and therefore its network address is seven. Similarly, node D has a network address of eleven. Accordingly, node E has a network address of 2, node F has a network address of 4, node G has a network address of 8, node H has a network address of 12, and node I has a network address of 14.

In one embodiment, node A may advantageously route a communication packet to a particular node through any intermediate node with a lower network address. Thus, to deliver a communication packet to node I, node A may initially send the packet through node B, node C, or node D and be assured of the packet arriving at node I. This is based upon the sequential nature of the scan test route sequence and the forwarding of communication packets by a recipient node to the next node in the sequence.

Figure 12:
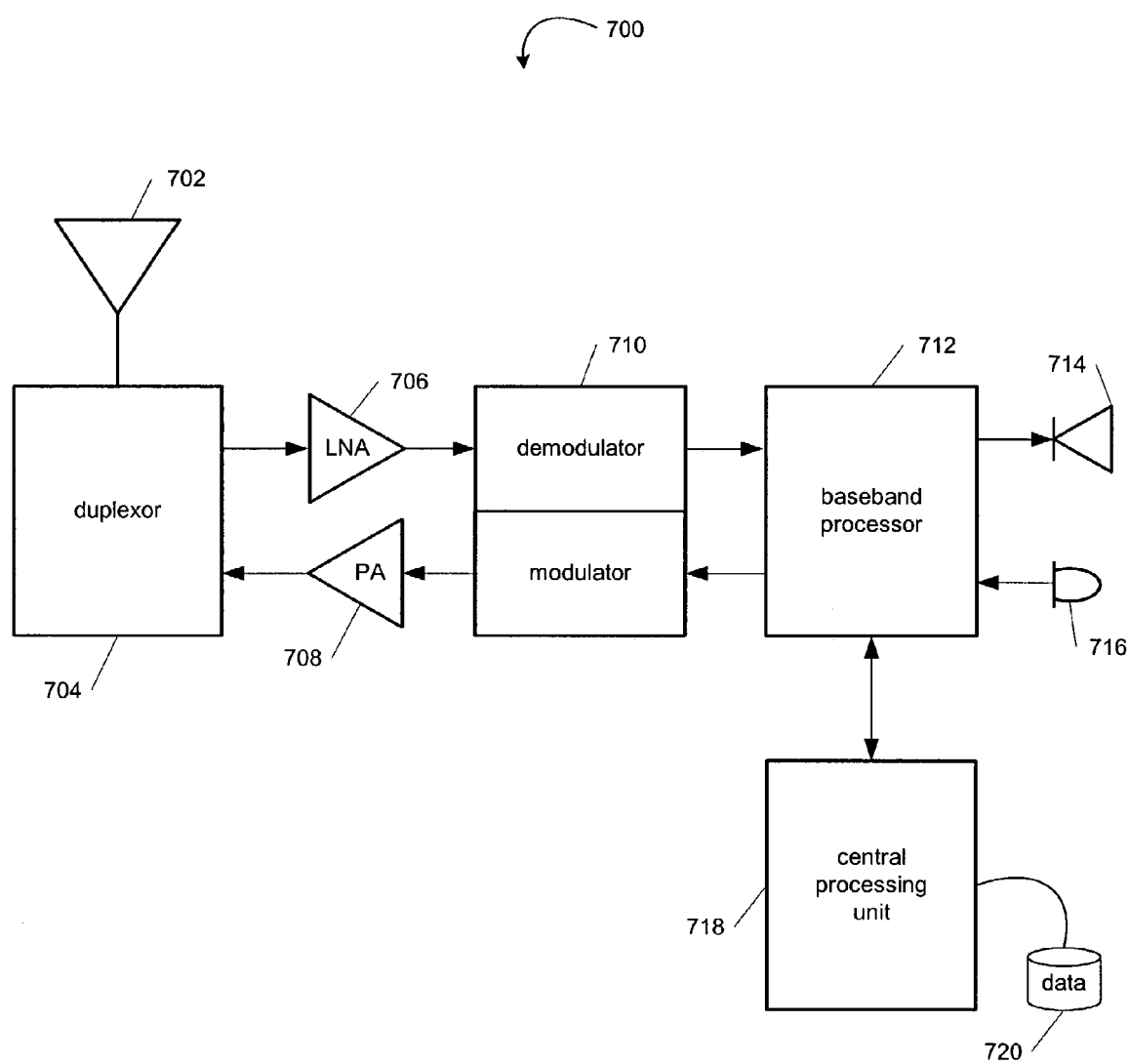
FIG. 12 is a block diagram illustrating an exemplary wireless communication device that may be used in connection with the various embodiments described herein.

FIG. 12 is a block diagram illustrating an exemplary wireless communication device 700 that may be used in connection with the various embodiments described herein. For example, the wireless communication device 700 may be used in conjunction with a handset or PDA network device or as a part of a sensor node in a wireless mesh network. However, other wireless communication devices and/or architectures may also be used, as will be clear to those skilled in the art.

In the illustrated embodiment, wireless communication device 700 comprises an antenna 702, a duplexor 704, a low noise amplifier ("LNA") 706, a power amplifier ("PA") 708, a modulation circuit 710, a baseband processor 712, a speaker 714, a microphone 716, a central processing unit ("CPU") 718, and a data storage area 720. In the wireless communication device 700, radio frequency ("RF") signals are transmitted and received by antenna 702. Duplexor 704 acts as a switch, coupling antenna 702 between the transmit and receive signal paths. In the receive path, received RF signals are coupled from a duplexor 704 to LNA 706. LNA 706 amplifies the received RF signal and couples the amplified signal to a demodulation portion of the modulation circuit 710.

Typically modulation circuit 710 will combine a demodulator and modulator in one integrated circuit ("IC"). The demodulator and modulator can also be separate components. The demodulator strips away the RF carrier signal leaving a base-band receive audio signal, which is sent from the demodulator output to the base-band processor 712.

If the base-band receive audio signal contains audio information, then base-band processor 712 decodes the signal and converts it to an analog signal. Then the signal is amplified and sent to the speaker 714. The base-band processor 712 also receives analog audio signals from the microphone 716. These analog audio signals are converted to digital signals and encoded by the base-band processor 712. The base-band processor 712 also codes the digital signals for transmission and generates a base-band transmit audio signal that is routed to the modulator portion of modulation circuit 710. The modulator mixes the base-band transmit audio signal with an RF carrier signal generating an RF transmit signal that is routed to the power amplifier 708. The power amplifier 708 amplifies the RF transmit signal and routes it to the duplexor 704 where the signal is switched to the antenna port for transmission by antenna 702.

The baseband processor 712 is also communicatively coupled with the central processing unit 718. The central processing unit 718 has access to a data storage area 720. The central processing unit 718 is preferably configured to execute instructions (i.e., computer programs or software) that can be stored in the data storage are 720. Computer programs can also be received from the baseband processor 712 and stored in the data storage are 720 or executed upon receipt. Such computer programs, when executed, enable the wireless communication device 700 to perform the various functions of the present invention as previously described.

In this description, the term "computer readable medium" is used to refer to any media used to provide executable instructions (e.g., software and computer programs) to the wireless communication device 700 for execution by the central processing unit 718. Examples of these media include the data storage area 720, microphone 716 (via the baseband processor 712), and antenna 702 (also via the baseband processor 712). These computer readable mediums are means for providing executable code, programming instructions, and software to the wireless communication device 700. The executable code, programming instructions, and software, when executed by the central processing unit 718, preferably cause the central processing unit 718 to perform the inventive features and functions previously described herein.

Figure 13:
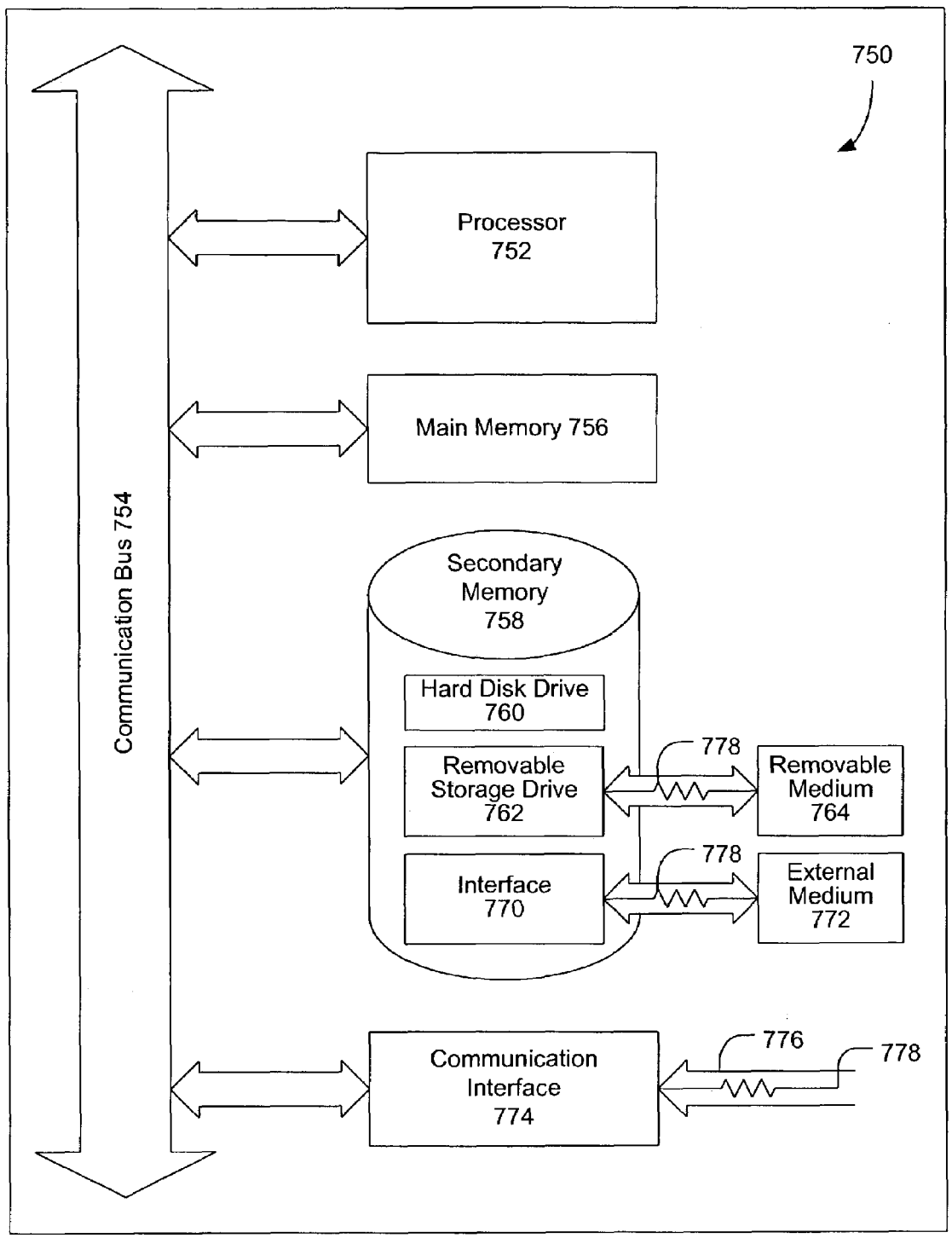
FIG. 13 is a block diagram illustrating an exemplary computer system that may be used in connection with the various embodiments described herein.

FIG. 13 is a block diagram illustrating an exemplary computer system 750 that may be used in connection with the various embodiments described herein. For example, the computer system 750 may be used in conjunction with a network device, a network access point, a router, a bridge, or other network infrastructure component. However, other computer systems and/or architectures may also be used, as will be clear to those having skill in the art.

The computer system 750 preferably includes one or more processors, such as processor 752. Additional processors may be provided, such as an auxiliary processor to manage input/output, an auxiliary processor to perform floating point mathematical operations, a special-purpose microprocessor having an architecture suitable for fast execution of signal processing algorithms (e.g., digital signal processor), a slave processor subordinate to the main processing system (e.g., back-end processor), an additional microprocessor or controller for dual or multiple processor systems, or a coprocessor. Such auxiliary processors may be discrete processors or may be integrated with the processor 752.

The processor 752 is preferably connected to a communication bus 754. The communication bus 754 may include a data channel for facilitating information transfer between storage and other peripheral components of the computer system 750. The communication bus 754 further may provide a set of signals used for communication with the processor 752, including a data bus, address bus, and control bus (not shown). The communication bus 754 may comprise any standard or non-standard bus architecture such as, for example, bus architectures compliant with industry standard architecture ("ISA"), extended industry standard architecture ("EISA"), Micro Channel Architecture ("MCA"), peripheral component interconnect ("PCI") local bus, or standards promulgated by the Institute of Electrical and Electronics Engineers ("IEEE") including IEEE 488 general-purpose interface bus ("GPIB"), IEEE 696/S-100, and the like.

Computer system 750 preferably includes a main memory 756 and may also include a secondary memory 758. The main memory 756 provides storage of instructions and data for programs executing on the processor 752. The main memory 756 is typically semiconductor-based memory such as dynamic random access memory ("DRAM") and/or static random access memory ("SRAM"). Other semiconductor-based memory types include, for example, synchronous dynamic random access memory ("SDRAM"), Rambus dynamic random access memory ("RDRAM"), ferroelectric random access memory ("FRAM"), and the like, including read only memory ("ROM").

The secondary memory 758 may optionally include a hard disk drive 760 and/or a removable storage drive 762, for example a floppy disk drive, a magnetic tape drive, a compact disc ("CD") drive, a digital versatile disc ("DVD") drive, etc. The removable storage drive 762 reads from and/or writes to a removable storage medium 764 in a well known manner. Removable storage medium 764 may be, for example, a floppy disk, magnetic tape, CD, DVD, etc.

The removable storage medium 764 is preferably a computer readable medium having stored thereon computer executable code (i.e., software) and/or data. The computer software or data stored on the removable storage medium 764 is read into the computer system 750 as electrical communication signals 778.

In alternative embodiments, secondary memory 758 may include other similar means for allowing computer programs or other data or instructions to be loaded into the computer system 750. Such means may include, for example, an external storage medium 772 and an interface 770. Examples of external storage medium 772 may include an external hard disk drive or an external optical drive, or and external magneto-optical drive.

Other examples of secondary memory 758 may include semiconductor-based memory such as programmable read-only memory ("PROM"), erasable programmable read-only memory ("EPROM"), electrically erasable read-only memory ("EEPROM"), or flash memory (block oriented memory similar to EEPROM). Also included are any other removable storage units 772 and interfaces 770, which allow software and data to be transferred from the removable storage unit 772 to the computer system 750.

Computer system 750 may also include a communication interface 774. The communication interface 774 allows software and data to be transferred between computer system 750 and external devices (e.g. printers), networks, or information sources. For example, computer software or executable code may be transferred to computer system 750 from a network server via communication interface 774. Examples of communication interface 774 include a modem, a network interface card ("NIC"), a communications port, a PCMCIA slot and card, an infrared interface, and an IEEE 1394 fire-wire, just to name a few.

Communication interface 774 preferably implements industry promulgated protocol standards, such as Ethernet IEEE 802 standards, Fiber Channel, digital subscriber line ("DSL"), asynchronous digital subscriber line ("ADSL"), frame relay, asynchronous transfer mode ("ATM"), integrated digital services network ("ISDN"), personal communications services ("PCS"), transmission control protocol/Internet protocol ("TCP/IP"), serial line Internet protocol/point to point protocol ("SLIP/PPP"), and so on, but may also implement customized or non-standard interface protocols as well.

Software and data transferred via communication interface 774 are generally in the form of electrical communication signals 778. These signals 778 are preferably provided to communication interface 774 via a communication channel 776. Communication channel 776 carries signals 778 and can be implemented using a variety of communication means including wire or cable, fiber optics, conventional phone line, cellular phone link, radio frequency (RF) link, or infrared link, just to name a few.

Computer executable code (i.e., computer programs or software) is stored in the main memory 756 and/or the secondary memory 758. Computer programs can also be received via communication interface 774 and stored in the main memory 756 and/or the secondary memory 758. Such computer programs, when executed, enable the computer system 750 to perform the various functions of the present invention as previously described.

In this description, the term "computer readable medium" is used to refer to any media used to provide computer executable code (e.g., software and computer programs) to the computer system 750. Examples of these media include main memory 756, secondary memory 758 (including hard disk drive 760, removable storage medium 764, and external storage medium 772), and any peripheral device communicatively coupled with communication interface 774 (including a network information server or other network device). These computer readable mediums are means for providing executable code, programming instructions, and software to the computer system 750.

In an embodiment that is implemented using software, the software may be stored on a computer readable medium and loaded into computer system 750 by way of removable storage drive 762, interface 770, or communication interface 774. In such an embodiment, the software is loaded into the computer system 750 in the form of electrical communication signals 778. The software, when executed by the processor 752, preferably causes the processor 752 to perform the inventive features and functions previously described herein.

Various embodiments may also be implemented primarily in hardware using, for example, components such as application specific integrated circuits ("ASICs"), or field programmable gate arrays ("FPGAs"). Implementation of a hardware state machine capable of performing the functions described herein will also be apparent to those skilled in the relevant art. Various embodiments may also be implemented using a combination of both hardware and software.

While the particular systems and methods herein shown and described in detail are fully capable of attaining the above described objects of this invention, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A method for identifying a plurality of nodes that are communicatively coupled to form a wireless mesh network, comprising:
    constructing a first data communication at a first node in a wireless mesh network, the first data communication comprising a plurality of fields including a type field configured to indicate that the first data communication is a single hop broadcast message;
    broadcasting the first data communication from the first node in the wireless mesh network, wherein the first data communication is received by one or more second nodes in the wireless mesh network;
    receiving an acknowledgement message at the first node from the one or more second nodes, wherein each acknowledgement message provides an indication of the quality of the wireless mesh network link between the first node and the particular second node that sent the respective acknowledgement message;
    constructing a second data communication at each of the one or more second nodes in response to the first data communication, the second data communication comprising a plurality of fields including a type field configured to indicate that the second data communication is a single hop broadcast message;
    broadcasting the second data communication from each of the one or more second nodes in the wireless mesh network, wherein the second data communication is received by the first node and one or more third nodes;
    disregarding each second data communication received by the first node;
    receiving an acknowledgement message at a particular second node from one or more third nodes, wherein each acknowledgement message provides an indication of the quality of the wireless mesh network link between the particular second node and the particular third node that sent the respective acknowledgement message;
    providing the first node wit information about each third node; and
    identifying the plurality of nodes tat are communicatively coupled to form the wireless mesh network.

2. The method of claim 1, further comprising recording at the first node the quality of the wireless mesh network link between the first node and a second node.

3. The method of claim 2, wherein the quality of the wireless mesh network link comprises signal strength.

4. The method of claim 2, wherein the quality of the wireless mesh network link comprises a link connectivity state.

5. The method of claim 1, further comprising recording at a second node the quality of the wireless mesh network link between said second node and a third node.

6. The method of claim 5, wherein an indication of the quality of the wireless mesh network link comprises signal strength.

7. The method of claim 5, wherein an indication of the quality of the wireless mesh network link comprises a link connectivity state.

8. The method of claim 1, further comprising recording at the first node the information about a third node.

9. The method of claim 1, further comprising identifying a route between the first node and a third node, said route including a first link between said first node and a second node and a second link between said second node and said third node.

10. A wireless communication device, comprising:
    a processor;
    a data storage area;
    a wireless conimunicahon means;
    a test agent stored in the data storage area and configured to be executed by the processor to construct a first data communication comprising a plurality of fields including a type field configured to indicate that the first data communication is a single hop broadcast message, the test agent further configured to broadcast the first data communication over a wireless communication network using said wireless communication means, wherein the fast data communication is received by one or more second wireless communication devices;
    wherein the test agent is further configured to receive a first acknowledgement messages from the one or more second wireless communication devices, said first acknowledgement message providing an indication of the quality of a wireless link between the first wireless communication device and the acknowledging second wireless communication device;
    wherein the test agent is further configured to receive a second acknowledgement message from the one or more second wireless communication devices, said second acknowledgement message providing an indication of the quality of a wireless link between the acknowledging second wireless communication device and a third wireless communication device; and
    wherein the test agent is further configured to identify a plurality of second and third wireless communication devices that are communicatively coupled with the wireless communication device to form a wireless mesh network.

11. The system of claim 10, wherein the test agent is further configured to store the quality of the wireless link between the wireless communication device and a second wireless communication device in the data storage area.

12. The system of claim 11, wherein the stored quality of the wireless link comprises signal strength.

13. The system of claim 11, wherein the stored quality of the wireless link comprises a link connectivity state.

14. The system of claim 10, wherein the test agent is further configured to store the quality of the wireless link between a second wireless communication device and a third wireless communication device in the data storage area.

15. The system of claim 14, wherein the stored quality of the wireless link comprises signal strength.

16. The system of claim 14, wherein the stored quality of the wireless link comprises a link connectivity state.

17. The system of claim 10, wherein the test agent is further configured to store information about a third wireless communication device in the data storage area.

18. The system of claim 10, wherein the test agent is further configured to identify a route between the wireless communication device and a third wireless communication device, said route including a first link between the wireless communication device and a second wireless communication device and a second link between said second wireless communication device and said third wireless communication device.

* * * * *